United States Patent
Leong

(10) Patent No.: US 12,431,897 B2
(45) Date of Patent: Sep. 30, 2025

(54) CASCODE SOLID-STATE SWITCH DEVICE AND POWER ELECTRONICS SYSTEM

(71) Applicant: Infineon Technologies Austria AG, Villach (AT)

(72) Inventor: Kennith Kin Leong, Villach (AT)

(73) Assignee: Infineon Technologies Austria AG, Villach (AT)

(*) Notice: Subject to any disclaimer, the term of this patent is extended or adjusted under 35 U.S.C. 154(b) by 68 days.

(21) Appl. No.: 18/335,503

(22) Filed: Jun. 15, 2023

(65) Prior Publication Data

US 2024/0421816 A1 Dec. 19, 2024

(51) Int. Cl.
*H03K 17/691* (2006.01)
*H02M 1/08* (2006.01)

(52) U.S. Cl.
CPC ............ *H03K 17/691* (2013.01); *H02M 1/08* (2013.01)

(58) Field of Classification Search
None
See application file for complete search history.

(56) References Cited

U.S. PATENT DOCUMENTS

| | | | |
|---|---|---|---|
| 8,766,275 B2* | 7/2014 | Iketani | H01L 27/0605 |
| | | | 257/E29.089 |
| 9,472,549 B2* | 10/2016 | Rose | H03K 17/74 |
| 9,825,622 B2* | 11/2017 | Chang | H03K 17/0822 |
| 10,084,442 B2* | 9/2018 | Ikeda | H03K 17/08142 |
| 10,715,131 B2* | 7/2020 | Bunin | H03K 17/0822 |
| 11,196,415 B2* | 12/2021 | Cairoli | H03K 17/102 |
| 11,258,444 B2* | 2/2022 | Prakash | H02J 9/062 |
| 11,451,161 B2* | 9/2022 | Hayashi | H02M 3/158 |
| 11,710,734 B2* | 7/2023 | Kono | H01L 29/808 |
| | | | 257/272 |
| 2015/0035586 A1* | 2/2015 | Weis | H03K 17/6871 |
| | | | 327/427 |
| 2017/0047841 A1* | 2/2017 | Zojer | H03K 17/10 |
| 2021/0067154 A1* | 3/2021 | Leong | H01L 24/49 |

* cited by examiner

*Primary Examiner* — Thomas J. Hiltunen
(74) *Attorney, Agent, or Firm* — Murphy, Bilak & Homiller, PLLC

(57) ABSTRACT

A cascode solid-state switch device includes a normally-off transistor and a normally-on transistor having a source electrically connected to a drain of the normally-off transistor. A gate charge of the cascode solid-state switch device is independent of both a voltage class of the cascode solid-state switch device and a drain-to-source on-state resistance of the cascode solid-state switch device. A circuit component of the cascode solid-state switch device and a power electronics circuit that includes the cascode solid-state switch device are also described.

16 Claims, 7 Drawing Sheets

CASCODE SOLID-STATE SWITCH DEVICE AND POWER ELECTRONICS SYSTEM

BACKGROUND

Transformer-driven power switch devices are used for switching high currents. These devices include power switches, such as Gallium Nitride (GaN) transistors. Transformers are used to transfer both control timing and power for controlling the power switches. The transformers may be coreless, such that they may be integrated within a silicon die. Rectifiers, pulldown control circuitry, and related circuitry may be integrated in the same die as a power switch, e.g., in a GaN die, such that a transformer-driven switch device is entirely comprised on a silicon die and a GaN die, and does not necessarily require a (large) cored transformer, auxiliary power supplies, or level shifting circuitry.

The amount of energy that can be transferred through the coils of a coreless transformer is limited. For example, quick turn on of a low ohmic high voltage GaN device is challenging when using a coreless transformer-driven power switch device to drive the GaN device. A voltage driven gate can be used to drive lower ohmic devices due to the local energy storage in the form of a capacitor. However, the coreless transformer-driven power switch device still must be specifically sized and programmed for each ohmic class of interest, each voltage class of interest, and for each technology class of interest.

Thus, there is a need for a single coreless transformer-driven power switch device platform that is suitable for driving devices having different ohmic classes, different voltage classes, and different technology classes.

SUMMARY

According to an embodiment of a cascode solid-state switch device, the cascode solid-state switch device comprises: a normally-off transistor; a normally-on transistor having a source electrically connected to a drain of the normally-off transistor; and a diode circuit comprising a plurality of series-connected first diodes connected in parallel with the normally-off transistor and at least one second diode connected antiparallel with the normally-off transistor, wherein a gate of the normally-on transistor is electrically connected to a first node of the series-connected first diodes and a second node of the at least one second diode, such that the cascode solid-state switch device is driven by a gate charge that is independent of both a voltage class of the cascode solid-state switch device and a drain-to-source on-state resistance of the cascode solid-state switch device.

According to an embodiment of a power electronics circuit, the power electronics circuit comprises: a cascode solid-state switch device; and a galvanically isolated gate driver configured to drive the cascode solid-state switch device, wherein the cascode solid-state switch device comprises: a normally-off transistor; a normally-on transistor having a source electrically connected to a drain of the normally-off transistor; and a diode circuit comprising a plurality of series-connected first diodes connected in parallel with the normally-off transistor and at least one second diode connected antiparallel with the normally-off transistor, wherein a gate of the normally-off transistor is controlled by the galvanically isolated gate driver, wherein a gate of the normally-on transistor is electrically connected to a first node of the series-connected first diodes and a second node of the at least one second diode, such that the cascode solid-state switch device is driven by a gate charge that is independent of both a voltage class of the cascode solid-state switch device and a drain-to-source on-state resistance of the cascode solid-state switch device.

According to an embodiment of a circuit component of a cascode solid-state switch device, the circuit component comprises: a normally-off transistor; and a diode circuit comprising a plurality of series-connected first diodes connected in parallel with the normally-off transistor and at least one second diode connected antiparallel with the normally-off transistor, wherein a node of the series-connected first diodes forms a first gate connection node for a normally-on transistor of the cascode solid-state switch device, wherein a node of the at least one second diode forms a second gate connection node for the normally-on transistor, wherein the plurality of series-connected first diodes is configured to set a clamp voltage for the normally-off transistor when the normally-off transistor is in an off-state, wherein the clamp voltage is set beyond a threshold voltage of the normally-on transistor, wherein a gate charge of the cascode solid-state switch device is independent of both a voltage class of the cascode solid-state switch device and a drain-to-source on-state resistance of the cascode solid-state switch device.

According to another embodiment of a cascode solid-state switch device, the cascode solid-state switch device comprises: a normally-off transistor; and a normally-on transistor having a source electrically connected to a drain of the normally-off transistor, wherein a gate charge of the cascode solid-state switch device is independent of both a voltage class of the cascode solid-state switch device and a drain-to-source on-state resistance of the cascode solid-state switch device.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a single coreless transformer-driven power switch device platform that is suitable for driving devices having different ohmic classes, different voltage classes, and different technology classes. The coreless transformer-driven power switch device platform includes a cascode solid-state switch device having a gate charge that is independent of both a voltage class of the cascode solid-state switch device and a drain-to-source on-state resistance of the cascode solid-state switch device. Accordingly, the gate charge or input capacitance of the cascode solid-state switch device is decoupled from its Ohmic class, voltage class, and even technology class, making these parameters independent from one another. With such an approach, all ohmic classes and/or voltage classes within a product family can offer the same gate charge. Gate charge is made independent of the ohmic class and/or voltage class by connecting a plurality of series-connected first diodes in parallel with a normally-off transistor of the cascode solid-state switch device and connecting at least one second diode antiparallel with the normally-off transistor. The gate of a normally-on transistor of the cascode solid-state switch device is electrically connected to a first node of the series-connected first diodes and a second node of the at least one second diode. With such a configuration, the cascode solid-state switch device is driven by a gate charge that is independent of both the voltage class and the drain-to-source on-state resistance of the cascode solid-state switch device. The anti-parallel diode(s) are also immune to parasitic inductances.

Described next, with reference to the figures, are exemplary embodiments of the cascode solid-state switch device, a component of the cascode solid-state switch device, and a power electronics system that includes the cascode solid-state switch device.

Figure 2:
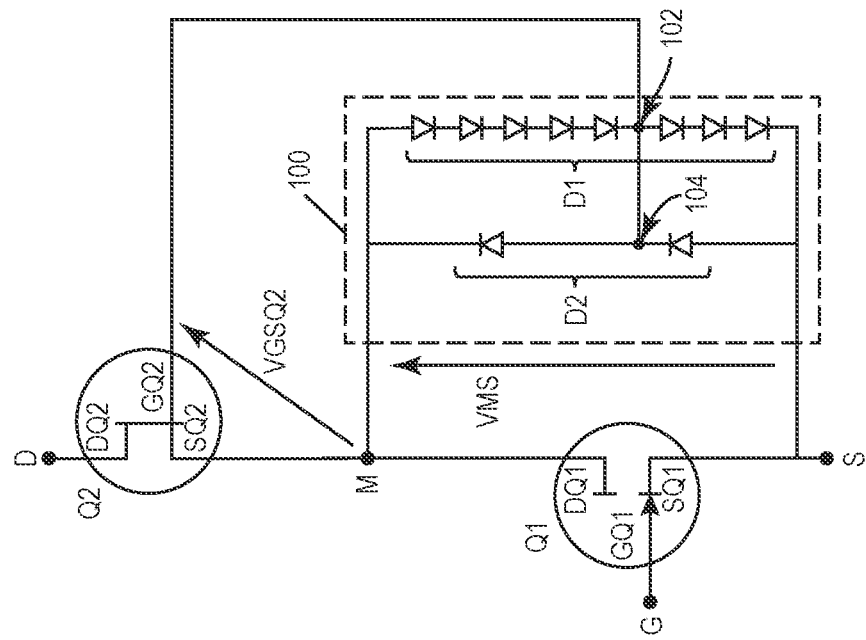
FIG. 2 illustrates a schematic diagram of the cascode solid-state switch device.
Figure 1:
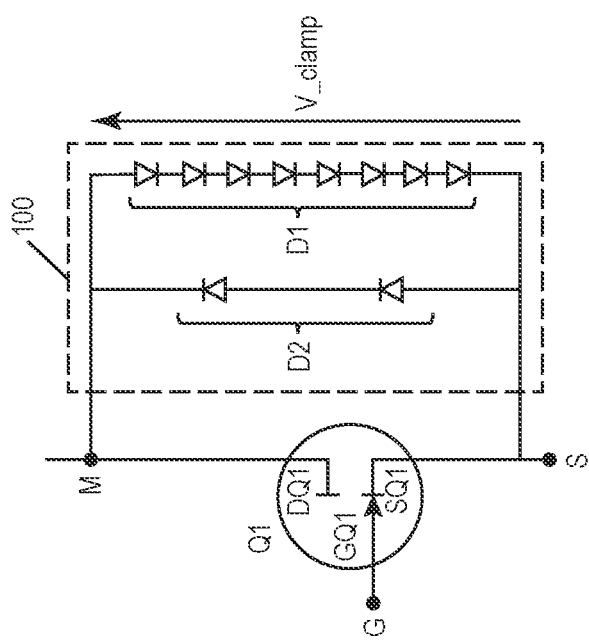
FIG. 1 illustrates a schematic diagram of a low-side circuit component of a cascode solid-state switch device.

FIG. 1 illustrates a schematic diagram of a low-side circuit component of the cascode solid-state switch device, and FIG. 2 illustrates a schematic diagram of the cascode solid-state switch device. The circuit component of the cascode solid-state switch device includes a normally-off (i.e., enhancement mode) transistor Q1 and a diode circuit 100. A current conduction channel is not present adjacent the gate GQ1 of the normally-off transistor Q1 without a suitable voltage applied across the gate GQ1 and source SQ1 of the normally-off transistor Q1.

The diode circuit 100 includes a plurality of series-connected first diodes D1 connected in parallel with the normally-off transistor Q1 and at least one second diode D2 connected antiparallel with the normally-off transistor Q1. Connected 'parallel' means that forward current flows through the series-connected first diodes D1 in the same direction as current flowing through the normally-off transistor Q1 (i.e., same polarity). Connected 'antiparallel' means that forward current flows through the series-connected first diodes D1 in the opposite direction as current flowing through the normally-off transistor Q1 (i.e., opposite polarity).

As shown in FIG. 2, a node 102 of the series-connected first diodes D1 forms a first gate connection node for a normally-on (i.e., depletion mode) transistor Q2 of the cascode solid-state switch device. A node 104 of the at least one second diode D2 forms a second gate connection node for the normally-on transistor Q2. A current conduction channel is present adjacent the gate GQ2 of the normally-on transistor Q2 without a voltage applied across the gate GQ2 and source SQ2 of the normally-on transistor Q2.

The normally-on transistor Q2 has a source SQ2 electrically connected to the drain DQ1 of the normally-off transistor Q1 to form the cascode solid-state switch device. The drain D of the cascode solid-state switch device corresponds to the drain DQ2 of the normally-on transistor Q2. The drain S of the cascode solid-state switch device corresponds to the source SQ1 of the normally-off transistor Q1. The drain G of the cascode solid-state switch device corresponds to the gate GQ1 of the normally-off transistor Q1.

The cascode solid-state switch device shown in FIG. 2 is a three terminal device where the gate GQ2 of the normally-on transistor Q2 is not actively controlled. Instead, the gate GQ2 of the normally-on transistor Q2 is passively controlled via the first gate connection node 102 of the series-connected first diodes D1 and the second gate connection node of the at least one second diode D2.

The series-connected first diodes D1 set a clamp voltage 'V_clamp' for the normally-off transistor Q1 when the normally-off transistor Q1 is in an off-state, i.e., when the gate-to-source voltage VGSQ1 of the normally-off transistor Q1 is below the threshold voltage VthQ1 of the normally-off transistor Q1. The clamp voltage V_clamp is set beyond the threshold voltage VthQ2 for turning off the normally-on transistor Q2. The voltage between the first gate connection node 102 of the series-connected first diodes D1 and the source SQ2 of the normally-on transistor Q2 reaches or exceeds the threshold voltage of the normally-on transistor Q2 when the voltage VMS across the normally-off transistor Q1 in the off-state rises to the clamp voltage V_clamp, turning off the normally-on transistor Q2. Consequently, the cascode solid-state switch device is driven by a gate charge that is independent of both the voltage class of the cascode solid-state switch device and the drain-to-source on-state resistance (RDSon) of the cascode solid-state switch device, and also may be independent of the technology class.

The clamp voltage V_clamp set by the series-connected first diodes D1 is determined by the number of first diodes D1 connected in series. For example, an arbitrary clamp voltage V_clamp of 9.6V may be realized by connecting eight gated diodes in series. A gated diode is a MOS transistor having its gate electrically connected to its source. In this example, the normally-off transistor Q1 may be a 20V normally-off GaN transistor device and the normally-on transistor Q2 may be a 650V normally-on GaN HEMT (high-electron mobility transistor).

The exact value of the clamp voltage V_clamp set by the series-connected first diodes D1 is arbitrary but must be higher than the threshold voltage VthQ2 of the normally-on transistor Q2 that forms part of the cascode solid-state switch device, since the clamp voltage V_clamp provides a constant turn off voltage for the normally-on transistor Q2. The series-connected first diodes D1 instead may be series-connected Schottky diodes.

In FIGS. 1 and 2, two second diodes D2 are connected in anti-parallel with the normally-off transistor Q1 and help discharge voltage VMS in the forward direction. As shown in FIG. 2, the gate GQ2 of the normally-on transistor Q2 is electrically connected to two specific nodes 102, 104 of the diode circuit 100. The first node 102 is between two of the series-connected first diodes D1 that are connected parallel with the normally-off transistor Q1 and the second node 104 is between two series-connected second diodes D2 that are connected antiparallel with the normally-off transistor Q1.

For example, in FIG. 2, the first node 102 is the cathode of the fifth first diode D1 from the top and ensures that the gate-to-source voltage VGSQ2 of the normally-on transistor Q2 is set to −6V when voltage VMS reaches 9.6V where voltage VMS is the voltage across the normally-off transistor Q1. Consequently, the gate-to-source voltage VGSQ2 of the normally-on transistor Q2 is beneficially decoupled from the voltage VMS across the normally-off transistor Q1 and the two second diodes D2 connected in anti-parallel with the normally-off transistor Q1 help discharge the voltage VMS in the forward direction.

The normally-off transistor Q1, the normally-on transistor Q2, the series-connected first diodes D1, and the at least one second diode D2 may be made from any type of semiconductor material such as Si, SiC, GaN, etc. The normally-off transistor Q1, the normally-on transistor Q2, the series-connected first diodes D1, and the at least one second diode D2 may be made from the same semiconductor material or different semiconductor materials. Separately or in combination, the normally-off transistor Q1 and the series-connected first diodes D1 may be monolithically integrated in the same semiconductor die (chip). The normally-off transistor Q1, the normally-on transistor Q2, the series-connected first diodes D1, and the at least one second diode D2 may be monolithically integrated in the same semiconductor die. Alternatively, the normally-off transistor Q1, the normally-on transistor Q2, the series-connected first diodes D1, and the at least one second diode D2 may be disposed in separate semiconductor dies that are co-packaged.

As explained above, the cascode solid-state switch device is driven by a gate charge that is independent of both the voltage class and the drain-to-source on-state resistance of the cascode solid-state switch device and the anti-parallel diode(s) D2 are immune to parasitic inductances.

Figure 3:
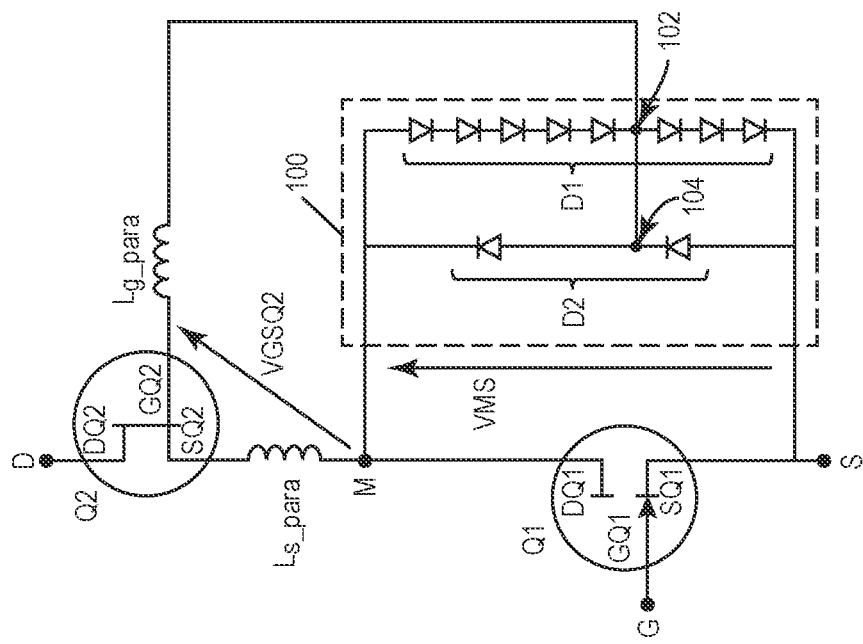
FIG. 3 illustrates the cascode solid-state switch device of FIG. 2, with typical parasitic inductances.

FIG. 3 illustrates the cascode solid-state switch device of FIG. 2, with typical parasitic inductances in the case of the normally-off transistor Q1 and the normally-on transistor Q2 being provided in separate semiconductor dies. In this case, the source SQ2 of the normally-on transistor Q2 is electrically connected to the drain DQ1 of the normally-off transistor Q1 by bond wires, a metal clip, metal tracks of a PCB (printed circuit board), etc. Likewise, the gate GQ2 of the normally-on transistor Q2 is electrically connected to the first and second gate connection nodes 102, 104 of the diode circuit 100 by one or more additional bond wires, metal clip, PCB metal tracks, etc. These connections have parasitic inductance. The parasitic inductance associated with the electrical connection between the source SQ2 of the normally-on transistor Q2 and the drain DQ1 of the normally-off transistor Q1 is labelled 'Ls_para' in FIG. 3. The parasitic inductance associated with the electrical connection between the gate GQ2 of the normally-on transistor Q2 and the first and second gate connection nodes 102, 104 of the diode circuit 100 is labelled 'Lg_para' in FIG. 3. The cascode solid-state switch device described herein is immune to the parasitic inductances Ls_para, Lg_para shown in FIG. 3.

Figure 4:
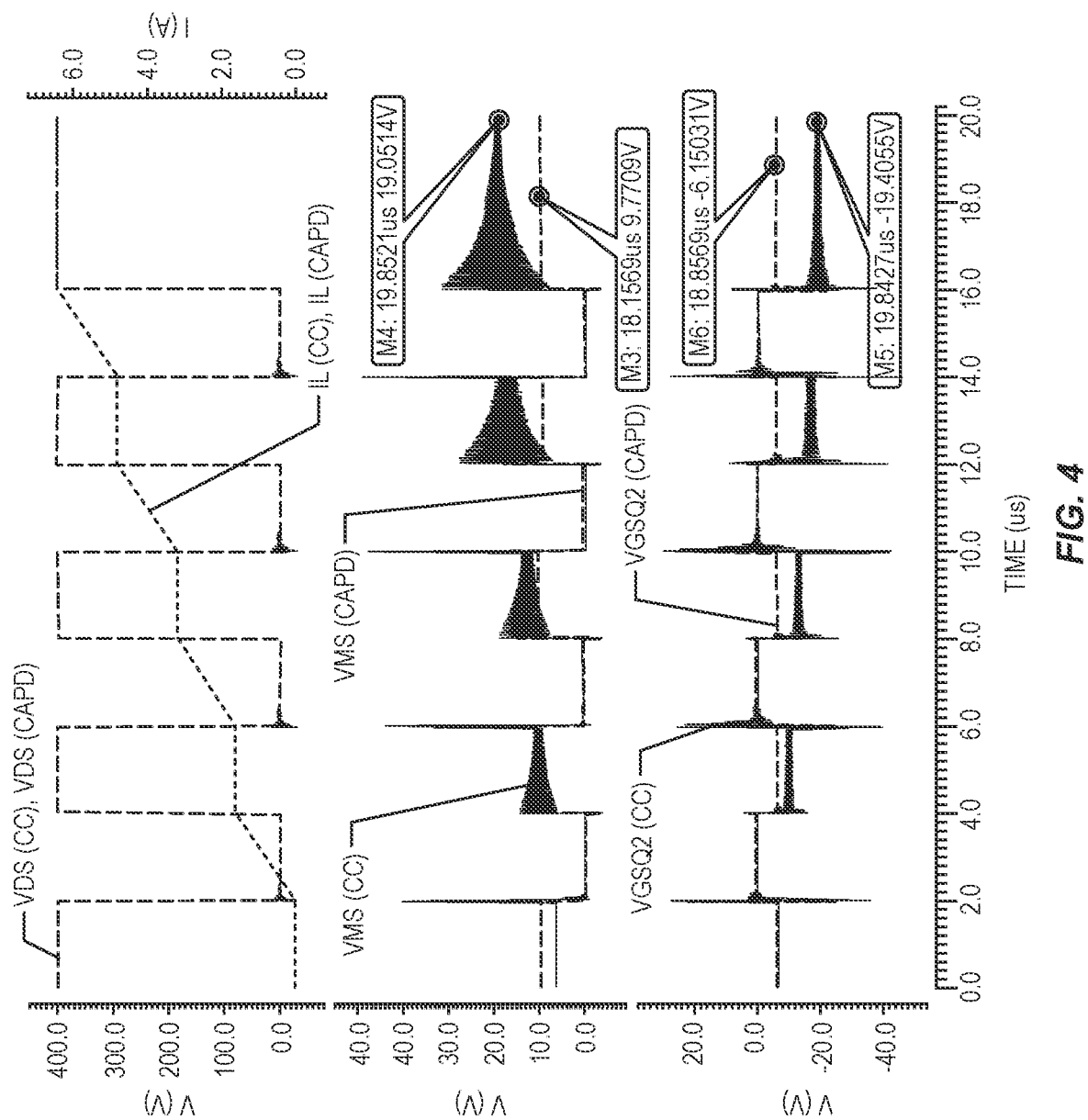
FIG. 4 illustrates simulation results for the cascode solid-state switch device and for a conventional cascode device.

FIG. 4 illustrates simulation results for the cascode solid-state switch device (CAPD) described herein and that includes the series-connected first diodes D1 and the second gate connection node of the at least one second diode D2, and for a conventional cascode device (CC) that does not include either the series-connected first diodes D1 or the at least one second diode D2. The parasitic inductances Ls_para, Lg_para shown in FIG. 3 were each set to 2 nH for the simulation. The 'CAPD' and 'CC' configurations were simulated using a typical chopper cell, switching from 400V.

The simulated waveforms shown in FIG. 4 include the cascode device drain-to-source voltage 'VDS', the cascode device conduction current 'IL', the voltage VMS across the normally-off transistor Q1, and the gate-to-source voltage VGSQ2 of the normally-on transistor Q2 for both 'CAPD' and 'CC' configurations. The simulated waveforms show that for the conventional cascode configuration 'CC', the voltage VMS across the normally-off transistor Q1 and the gate-to-source voltage VGSQ2 of the normally-on transistor Q2 are almost inverse mirror of each other with the exception that higher oscillations are observed in the VMS voltage due to much higher current conducting through the low side switch. Due to the oscillations, the steady state off-state voltages of the VMS voltage appear to increase with increasing current and the gate-to-source voltage VGSQ2 of the normally-on transistor Q2 appears to decrease with increasing current. In the ideal condition, these two voltages should return to the same value of 6V and −6V in the simulation but the last data point indicates that the voltages reach approximately 19V and −19V, respectively.

For the 'CAPD' configuration, the voltage VMS across the normally-off transistor Q1 and the gate-to-source voltage VGSQ2 of the normally-on transistor Q2 are not inverse mirrors of one another. Furthermore, significantly less oscillations arise and the steady state off-state voltages always return to the same value of approximately 9.7V and −6.1V, respectively, independent of the conduction current level. Consequently, the 'CAPD' configuration is immune to the parasitic inductances Ls_para, Lg_para shown in FIG. 3. This demonstrates that with the 'CAPD' configuration, the voltage VMS across the normally-off transistor Q1 and the gate-to-source voltage VGSQ2 of the normally-on transistor Q2 can be fully decoupled and are very stable.

Figure 5:
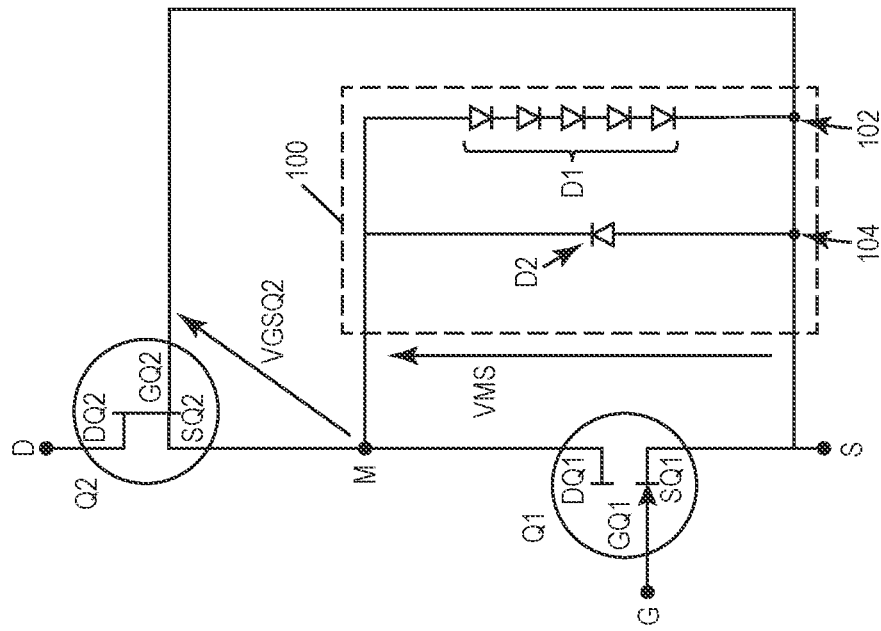
FIG. 5 illustrates the cascode solid-state switch device, according to another embodiment.

FIG. 5 illustrates the cascode solid-state switch device, according to another embodiment. The embodiment illustrated in FIG. 5 is similar to the embodiment illustrated in FIG. 2. In FIG. 5, a single second diode D1 is connected antiparallel with the normally-off transistor Q1 and both the first and second nodes 102, 104 of the diode circuit 100 are at the source potential of the normally-off transistor Q1. In this embodiment, the voltage VMS across the normally-off transistor Q1 and the gate-to-source voltage VGSQ2 of the normally-on transistor Q2 can be fully decoupled and are very stable. Accordingly, the gate GQ2 of the normally-on transistor Q2 is electrically connected to the source SQ1 of the normally-off transistor Q1 and a single antiparallel second diode D2 is used in FIG. 5. More generally, at least one second diode D1 is connected antiparallel with the normally-off transistor Q1. In the case of two or more series-connected second diodes D2 connected antiparallel with the normally-off transistor Q1, the second gate connection node 104 of the diode circuit 100 is between two of the series-connected second diodes D2.

Figure 6:
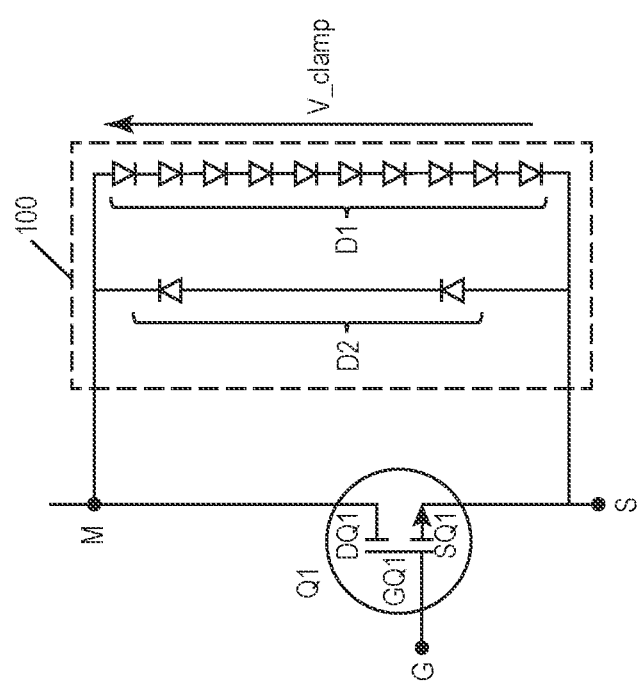
FIG. 6 illustrates a schematic diagram of the same low-side circuit component of the cascode solid-state switch device as shown in FIG. 1, according to another embodiment.

FIG. 6 illustrates a schematic diagram of the same low-side circuit component of the cascode solid-state switch device as shown in FIG. 1, according to another embodiment. In FIG. 6, the series-connected first diodes D1 are series-connected Schottky diodes. For example, the normally-off transistor Q1 may be a 20V GaN device. In the case of an arbitrary clamp voltage V_clamp of 10V, which can be chosen by series connecting ten Schottky diodes. This configuration yields an estimated RDSon value of 3.3 mOhm with gate charge of 2 nC.

As explained herein, each embodiment of the cascode solid-state switch device has a gate charge that is independent of both the voltage class of the cascode solid-state switch device and the drain-to-source on-state resistance (RDSon) of the cascode solid-state switch device, and also may be independent of the technology class. This means that the gate charge and input capacitance of the cascode solid-state switch device are the same.

Consequently, a normally-on device from any technology class can be used as the normally-on transistor Q2 of the cascode solid-state switch device. FIGS. 7 through 11 illustrate different embodiments of the cascode solid-state switch device for different technology classes of the normally-on transistor Q2, with the same input behavior for all embodiments regardless of technology class, voltage class, or even ohmic class. This means that a low ohmic high voltage GaN device with a gate charge of 2 nC can be drive, which is lower than a typical 190 mOhm GaN discrete, or a 1200V SiC JFET (junction field-effect transistor) can be driven with the same gate charge of 2 nC. This is possible by decoupling the voltage VMS across the normally-off transistor Q1 from the gate-to-source voltage VGSQ2 of the normally-on transistor Q2. Since the voltage VMS across the normally-off transistor Q1 during the off-state is always the same, the input behavior and therefore the gate charge can always be constant.

Figure 7:
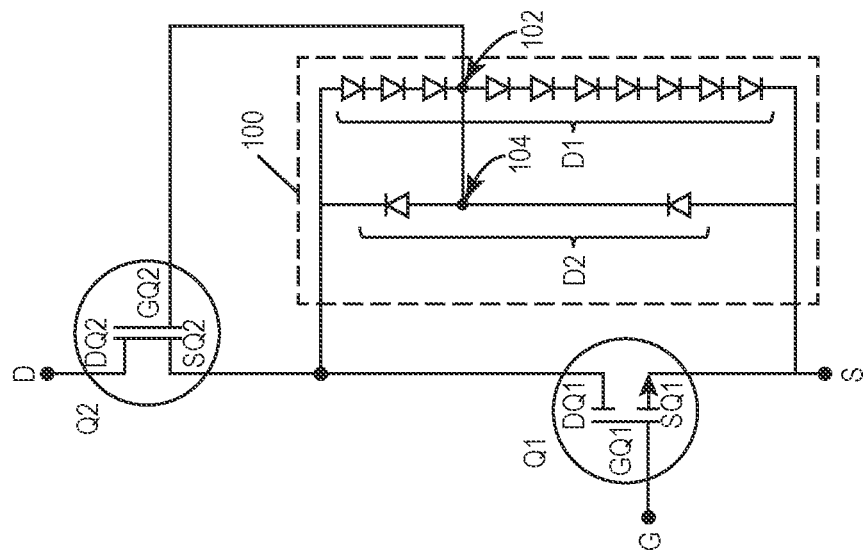

In FIG. 7, the normally-off transistor Q1 is a 20V normally-off GaN transistor device, the normally-on transistor Q2 is a 200V normally-on GaN transistor device, and the normally-on transistor Q2 has a threshold voltage VthQ2 of about -2V. Since the threshold voltage VthQ2 of the normally-on transistor Q2 is about -2V in this example, the gate GQ2 of the normally-on transistor Q2 can be electrically connected to the cathode of the third diode from the top of the series-connected first diodes D1 to yield a clamped gate-to-source voltage VGSQ2 of about -3V for the normally-on transistor Q2 when the voltage VMS across the normally-off transistor Q1 reaches 10V in the off-state. The gate GQ2 of the normally-on transistor Q2 is also electrically connected to the midpoint of the two anti-parallel second diodes D2 in this example. Since the normally-off and normally-on transistors Q1, Q2 that form the cascode solid-state switch device have the same technology platform in this example (GaN), both transistors Q1, Q2 may be monolithically integrated into the same die (chip).

Figure 8:
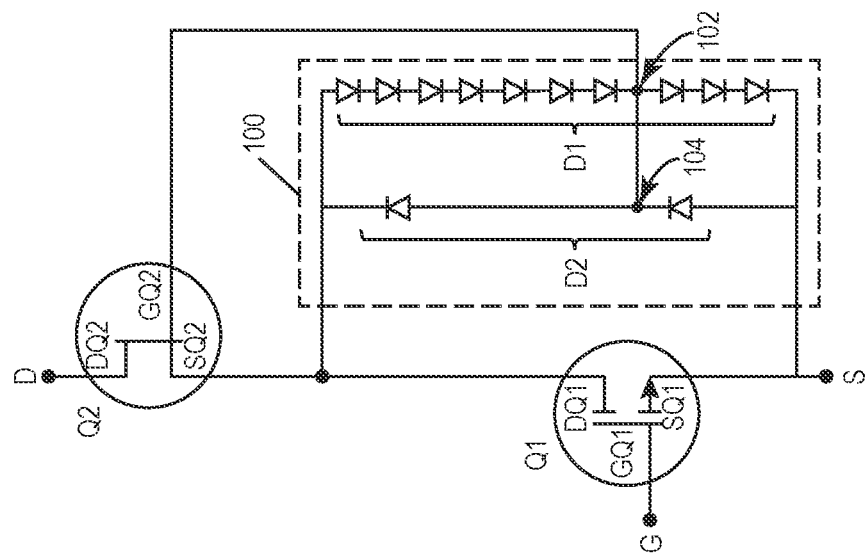

In FIG. 8, the normally-off transistor Q1 is a 20V normally-off GaN transistor device, the normally-on transistor Q2 is a 650V normally-on GaN transistor device, and the normally-on transistor Q2 has a threshold voltage VthQ2 of about -6V. Since the threshold voltage VthQ2 of the normally-on transistor Q2 is about -6V in this example, the gate GQ2 of the normally-on transistor Q2 can be electrically connected to the cathode of the seventh diode from the top of the series-connected first diodes D1 to yield a clamped gate-to-source voltage VGSQ2 of about -7V for the normally-on transistor Q2 when the voltage VMS across the normally-off transistor Q1 reaches 10V in the off-state. Since the normally-off and normally-on transistors Q1, Q2 that form the cascode solid-state switch device have the same technology platform in this example (GaN), both transistors Q1, Q2 may be monolithically integrated into the same die (chip).

Figure 9:
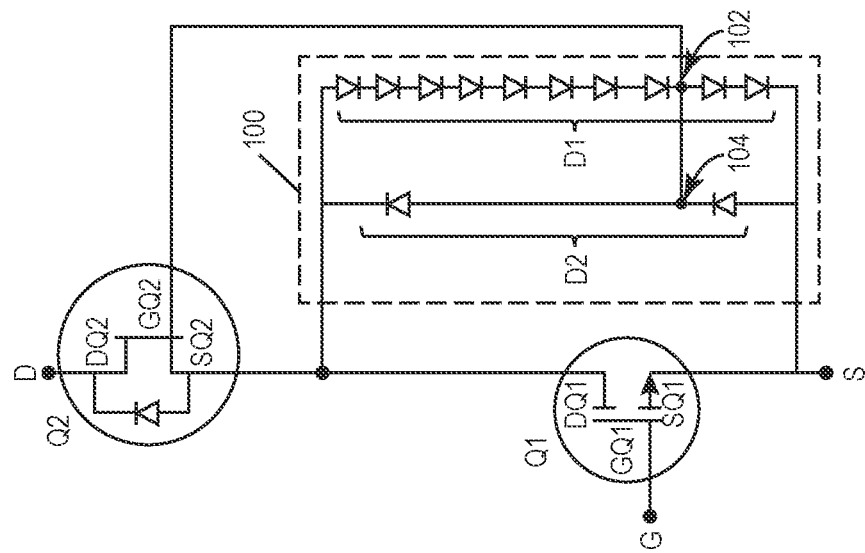
FIGS. 7 through 11 illustrate additional embodiments of the cascode solid-state switch device.

In FIG. 9, the normally-off transistor Q1 is a 20V normally-off GaN transistor device, the normally-on transistor Q2 is a 1200V normally-on SiC JFET device, and the normally-on transistor Q2 has a threshold voltage VthQ2 of about -7V. Since the threshold voltage VthQ2 of the normally-on transistor Q2 is about -7V in this example, the gate GQ2 of the normally-on transistor Q2 can be electrically connected to the cathode of the eight diode from the top of the series-connected first diodes D1 to yield a clamped gate-to-source voltage VGSQ2 of about -8V for the normally-on transistor Q2 when the voltage VMS across the normally-off transistor Q1 reaches 10V in the off-state. Since the normally-off and normally-on transistors Q1, Q2 that form the cascode solid-state switch device have different technology platforms in this example (GaN for Q1 and SiC for Q2), the transistors Q1, Q2 are formed in different dies which can be co-packaged.

Figure 10:
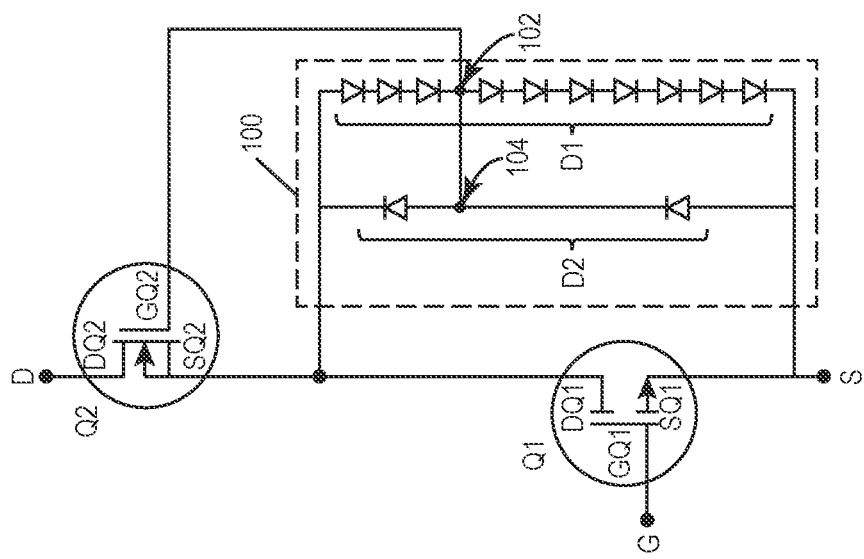

In FIG. 10, the normally-off transistor Q1 is a 20V normally-off GaN transistor device, the normally-on transistor Q2 is a Si depletion mode FET, and the normally-on transistor Q2 has a threshold voltage VthQ2 of about -2V. Since the threshold voltage VthQ2 of the normally-on transistor Q2 is about -2V in this example, the gate GQ2 of the normally-on transistor Q2 can be electrically connected to the cathode of the third diode from the top of the series-connected first diodes D1 to yield a clamped gate-to-source voltage VGSQ2 of about -3V for the normally-on transistor Q2 when the voltage VMS across the normally-off transistor Q1 reaches 10V in the off-state. Since the normally-off and normally-on transistors Q1, Q2 that form the cascode solid-state switch device have different technology platforms in this example (GaN for Q1 and Si for Q2), the transistors Q1, Q2 are formed in different dies which can be co-packaged.

Figure 11:
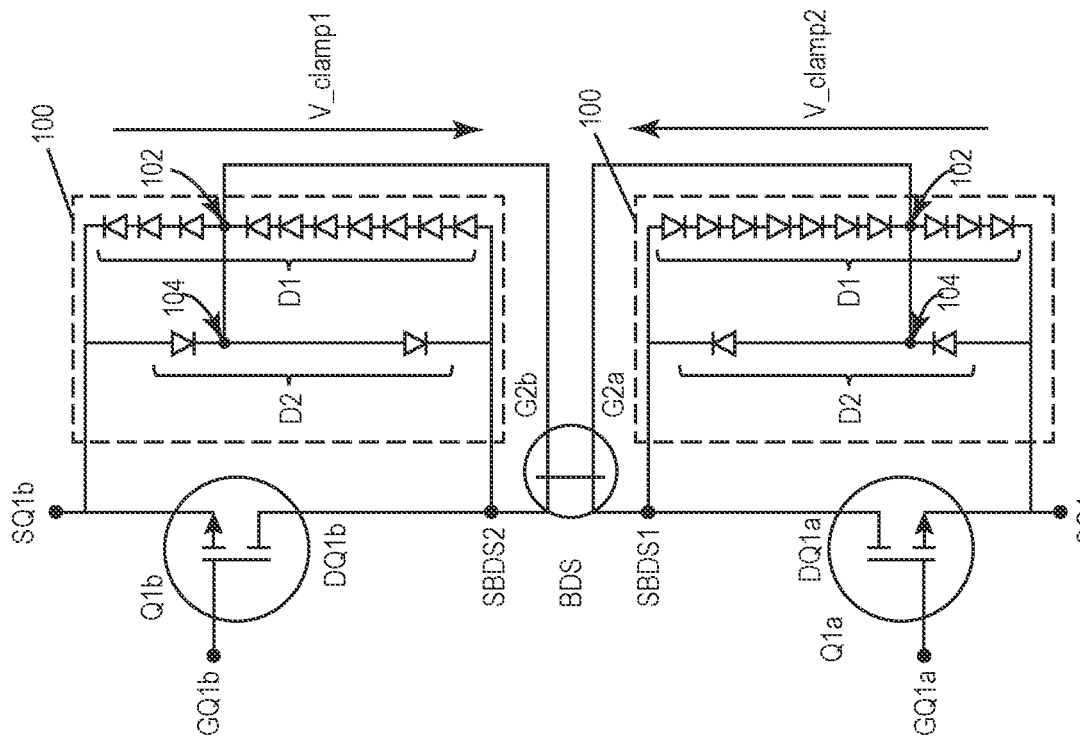

In FIG. 11, two normally-off transistors Q1a, Q1b are used. For example, the normally-off transistors Q1a, Q1b may be 20V normally-off GaN transistor devices. The normally-on transistor Q2 may be a normally-on GaN bidirectional switch device BDS having a first source SBDS1 electrically connected to the drain DQ1a of the first normally-off transistor Q1a and a second source SBDS2 electrically connected to the drain DQ1b of the second normally-off transistor Q1b, such that the cascode solid-state switch device is a bidirectional device.

The normally-on GaN bidirectional switch device BDS has four primary operational states: OFF/OFF in which both gates G2a, G2b of the bidirectional switch device BDS are off; ON/ON in which both gates G2a, G2b of the bidirectional switch device BDS are on; ON/OFF in which the first gate G2a of the bidirectional switch device BDS is on and the second gate G2b of the bidirectional switch device BDS is off; and OFF/ON in which the first gate G2a of the bidirectional switch device BDS is off and the second gate G2b of the bidirectional switch device BDS is on. The typical operation of the normally-on GaN bidirectional switch device BDS includes transitioning from ON/OFF to ON/ON, and from OFF/ON to ON/ON. The current flow direction depends on the polarity across the first and second input-output terminals S1, S2 of the bidirectional cascode device and can be reversed by changing the polarity.

For the bidirectional cascode device shown in FIG. 11, both normally-off transistors Q1a, Q1b include the diode circuit 100 described herein to set the clamp voltage V_clamp1, V_clamp2 for both normally-off transistors Q1a, Q1b when the respective normally-off transistor Q1a, Q1b is in an off-state. The clamp voltage V_clamp1, V_clamp2 for both normally-off transistors Q1a, Q1b is set beyond the threshold voltage VthQ2a, VthQ2b for turning off the respective gates G2a, G2b of the normally-on GaN bidirectional switch device BDS.

The bidirectional cascode switch device shown in FIG. 11 is a four terminal device where both gates GQ2a, GQ2b of the normally-on GaN bidirectional switch device BDS are not actively controlled. Instead, the first gate GQ2a of the normally-on GaN bidirectional switch device BDS is passively controlled via the first and second gate connection nodes 102a, 104a of the diode circuit 100 for the first normally-off transistor Q1a. The second gate GQ2b of the normally-on GaN bidirectional switch device BDS is passively controlled via the first and second gate connection nodes 102a, 104a of the diode circuit 100 for the second normally-off transistor Q1b. The gate and source terminals GQ1a, GQ1b, SQ1a, SQ1b of the normally-off transistors Q1a, Q1b form the terminals of the bidirectional cascode switch device shown in FIG. 11.

In one embodiment, both normally-off transistors Q1*a*, Q1*b* are 20V normally-off GaN transistor devices, the normally-on GaN bidirectional switch device BDS is a 650V normally-on GaN bidirectional transistor device, and both gates G2*a*, G2*b* of the normally-on GaN bidirectional switch device BDS have a threshold voltage VthQ2*a*, VthQ2*b* of about −6V. Since the threshold voltage VthQ2*a*, VthQ2*b* of both gates G2*a*, G2*b* of the normally-on GaN bidirectional switch device BDS is about −6V in this example, both gates G2*a*, G2*b* of the normally-on GaN bidirectional switch device BDS can be electrically connected to the cathode of the seventh diode from the top of the series-connected first diodes D1 of the diode circuit 100 for the respective normally-off transistors Q1*a*, Q1*b* to yield a clamped gate-to-source voltage VGSQ2*a*, VGSQ2*b* of about −7V for both gates G2*a*, G2*b* of the normally-on GaN bidirectional switch device BDS when the voltage VMSa, VMSb across the corresponding normally-off transistor Q1*a*, Q1*b* reaches 10V in the off-state. Since the normally-off transistors Q1*a*, Q1*b* and the normally-on GaN bidirectional switch device BDS that form the bidirectional cascode solid-state switch device have the same technology platform in this example (GaN), all three transistors Q1*a*, Q1*b*, BDS may be monolithically integrated into the same die (chip).

Figure 12:
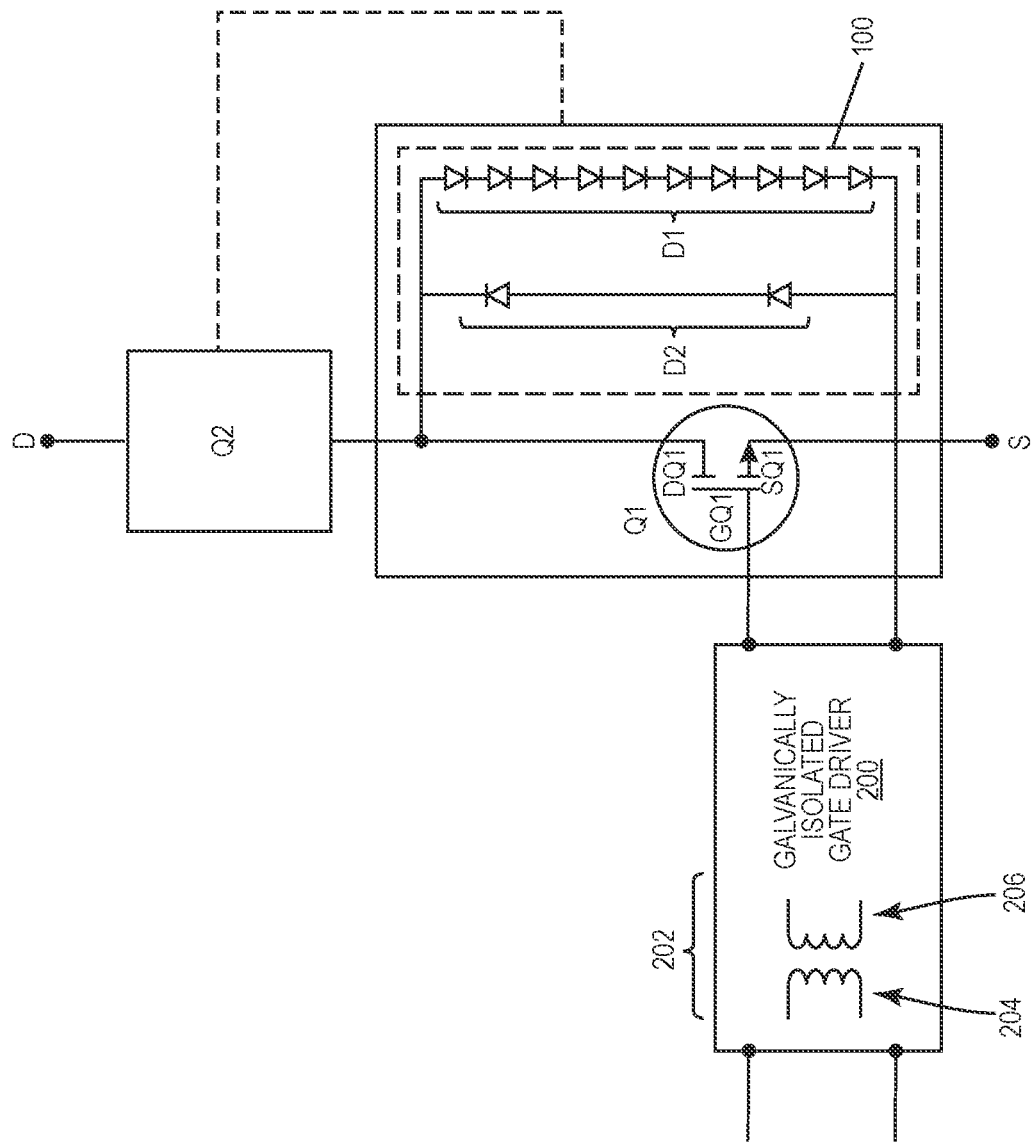
FIG. 12 illustrates an embodiment of a power electronics circuit that includes the cascode solid-state switch device and a galvanically isolated gate driver configured to drive the cascode solid-state switch device.

FIG. 12 illustrates an embodiment of a power electronics circuit that includes the cascode solid-state switch device and a galvanically isolated gate driver 200 configured to drive the cascode solid-state switch device. The galvanically isolated gate driver 200 may include a transformer 202 for transferring power and signals to the galvanically isolated gate driver 200. In one embodiment, the transformer 202 is a coreless transformer. In the case of a coreless transformer, the primary and secondary side windings (coils) 204, 206 of the transformer 202 are integrated into an integrated circuit (IC) such that the transformer windings 204, 206 are placed close enough together to save (omit) the core. The transformer 202 instead may include a core for directing the magnetic flux to the windings 204, 206.

The galvanically isolated gate driver 200 may include a rectifier (not shown in FIG. 12) such as a diode bridge rectifier or synchronous rectifier coupled to the winding 206 on the secondary side of the transformer 202, for rectifying energy transferred via the transformer 202 to the cascode solid-state switch device. The gate GQ1 of the normally-off transistor Q1 of the cascode solid-state switch device is controlled by the galvanically isolated gate driver 200 via the rectified energy.

The universal cascode with constant gate charge enables connection of the galvanically isolated gate driver 200 to drive the gate GQ1 of the normally-off transistor Q1 of the cascode solid-state switch device. Consequently, only one gate driver design is needed to support all RDSon/voltage/technology classes supported by the cascode solid-state switch device. Furthermore, the driving requirement is simplified which significantly reduces driving losses and design variants, yielding a universal cascode isolated gate driver with constant gate charge.

Although the present disclosure is not so limited, the following numbered examples demonstrate one or more aspects of the disclosure.

Example 1. A cascode solid-state switch device, comprising: a normally-off transistor; a normally-on transistor having a source electrically connected to a drain of the normally-off transistor; and a diode circuit comprising a plurality of series-connected first diodes connected in parallel with the normally-off transistor and at least one second diode connected antiparallel with the normally-off transistor, wherein a gate of the normally-on transistor is electrically connected to a first node of the series-connected first diodes and a second node of the at least one second diode, such that the cascode solid-state switch device is driven by a gate charge that is independent of both a voltage class of the cascode solid-state switch device and a drain-to-source on-state resistance of the cascode solid-state switch device.

Example 2. The cascode solid-state switch device of example 1, wherein the plurality of series-connected first diodes is configured to set a clamp voltage for the normally-off transistor when the normally-off transistor is in an off-state, wherein the clamp voltage is set beyond a threshold voltage of the normally-on transistor, and wherein a voltage between the first node and the source of the normally-on transistor reaches or exceeds the threshold voltage of the normally-on transistor when a voltage across the normally-off transistor in the off-state rises to the clamp voltage.

Example 3. The cascode solid-state switch device of example 1 or 2, wherein the first node is between two of the series-connected first diodes, wherein two series-connected second diodes are connected antiparallel with the normally-off transistor, and wherein the second node is between the two series-connected second diodes.

Example 4. The cascode solid-state switch device of example 1 or 2, wherein a single second diode is connected antiparallel with the normally-off transistor, and wherein both the first node and the second node are at a source potential of the normally-off transistor.

Example 5. The cascode solid-state switch device of any of examples 1 through 4, wherein the plurality of series-connected first diodes comprises a plurality of series-connected Schottky diodes.

Example 6. The cascode solid-state switch device of any of examples 1 through 3 and 5, wherein a plurality of series-connected second diodes is connected antiparallel with the normally-off transistor, and wherein the second node is between two of the series-connected second diodes.

Example 7. The cascode solid-state switch device of any of examples 1 through 6, wherein the normally-off transistor is a normally-off GaN transistor, wherein the normally-on transistor is a normally-on GaN transistor, and wherein the normally-on GaN transistor has a higher voltage rating than the normally-off GaN transistor.

Example 8. The cascode solid-state switch device of any of examples 1 through 7, wherein the normally-off transistor is a normally-off GaN transistor, wherein the normally-on transistor is a normally-on GaN bidirectional switch device, wherein the normally-on GaN bidirectional switch device has a first source electrically connected to the drain of the normally-off transistor and a second source electrically connected to a drain of an additional normally-off transistor such that the cascode solid-state switch device is a bidirectional device, and wherein the normally-on GaN bidirectional switch device has a higher voltage rating than the normally-off GaN transistor and the additional normally-off GaN transistor.

Example 9. The cascode solid-state switch device of example 8, further comprising: an additional diode circuit comprising a plurality of series-connected third diodes connected in parallel with the additional normally-off transistor and at least one fourth diode connected antiparallel with the additional normally-off transistor, wherein a gate of the additional normally-on transistor is electrically connected to a first node of the series-connected third diodes and a second node of the at least one fourth diode.

Example 10. The cascode solid-state switch device of any of examples 1 through 9, wherein the normally-off transistor and the plurality of series-connected first diodes are monolithically integrated in the same semiconductor die.

Example 11. The cascode solid-state switch device of any of examples 1 through 9, wherein the normally-off transistor, the normally-on transistor, the plurality of series-connected first diodes, and the at least one second diode are monolithically integrated in the same semiconductor die.

Example 12. The cascode solid-state switch device of any of examples 1 through 9, wherein the normally-off transistor, the normally-on transistor, the plurality of series-connected first diodes, and the at least one second diode are disposed in separate semiconductor dies that are co-packaged.

Example 13. The cascode solid-state switch device of any of examples 1 through 12, wherein the normally-on transistor is a bidirectional switch.

Example 14. A power electronics circuit, comprising: a cascode solid-state switch device; and a galvanically isolated gate driver configured to drive the cascode solid-state switch device, wherein the cascode solid-state switch device comprises: a normally-off transistor; a normally-on transistor having a source electrically connected to a drain of the normally-off transistor; and a diode circuit comprising a plurality of series-connected first diodes connected in parallel with the normally-off transistor and at least one second diode connected antiparallel with the normally-off transistor, wherein a gate of the normally-off transistor is controlled by the galvanically isolated gate driver, wherein a gate of the normally-on transistor is electrically connected to a first node of the series-connected first diodes and a second node of the at least one second diode, such that the cascode solid-state switch device is driven by a gate charge that is independent of both a voltage class of the cascode solid-state switch device and a drain-to-source on-state resistance of the cascode solid-state switch device.

Example 15. The power electronics circuit of example 14, wherein the plurality of series-connected first diodes is configured to set a clamp voltage for the normally-off transistor when the normally-off transistor is in an off-state, wherein the clamp voltage is set beyond a threshold voltage of the normally-on transistor, and wherein a voltage between the first node and the source of the normally-on transistor reaches or exceeds the threshold voltage of the normally-on transistor when a voltage across the normally-off transistor in the off-state rises to the clamp voltage.

Example 16. The power electronics circuit of example 14 or 15, wherein the first node is between two of the series-connected first diodes, wherein two series-connected second diodes are connected antiparallel with the normally-off transistor, and wherein the second node is between the two series-connected second diodes.

Example 17. The power electronics circuit of example 14 or 15, wherein a single second diode is connected antiparallel with the normally-off transistor, and wherein both the first node and the second node are at a source potential of the normally-off transistor.

Example 18. The power electronics circuit of any of examples 14 through 17, wherein the plurality of series-connected first diodes comprises a plurality of series-connected Schottky diodes.

Example 19. The power electronics circuit of any of examples 14 and 16 and 18, wherein a plurality of series-connected second diodes is connected antiparallel with the normally-off transistor, and wherein the second node is between two of the series-connected second diodes.

Example 20. The power electronics circuit of any of examples 14 through 19, wherein the normally-off transistor is a normally-off GaN transistor, wherein the normally-on transistor is a normally-on GaN transistor, and wherein the normally-on GaN transistor has a higher voltage rating than the normally-off GaN transistor.

Example 21. A circuit component of a cascode solid-state switch device, the circuit component comprising: a normally-off transistor; and a diode circuit comprising a plurality of series-connected first diodes connected in parallel with the normally-off transistor and at least one second diode connected antiparallel with the normally-off transistor, wherein a node of the series-connected first diodes forms a first gate connection node for a normally-on transistor of the cascode solid-state switch device, wherein a node of the at least one second diode forms a second gate connection node for the normally-on transistor, wherein the plurality of series-connected first diodes is configured to set a clamp voltage for the normally-off transistor when the normally-off transistor is in an off-state, wherein the clamp voltage is set beyond a threshold voltage of the normally-on transistor, wherein a gate charge of the cascode solid-state switch device is independent of both a voltage class of the cascode solid-state switch device and a drain-to-source on-state resistance of the cascode solid-state switch device.

Example 22. The circuit component of example 21, wherein the first gate connection node is between two of the series-connected first diodes, wherein two series-connected second diodes are connected antiparallel with the normally-off transistor, and wherein the second gate connection node is between the two series-connected second diodes.

Example 23. The circuit component of example 21, wherein a single second diode is connected antiparallel with the normally-off transistor, and wherein both the first gate connection node and the second gate connection node are at a source potential of the normally-off transistor.

Example 24. The circuit component of any of examples 21 through 23, wherein the plurality of series-connected first diodes comprises a plurality of series-connected Schottky diodes.

Example 25. The circuit component of any of examples 21, 22 and 24, wherein a plurality of series-connected second diodes is connected antiparallel with the normally-off transistor, and wherein the second gate connection node is between two of the series-connected second diodes.

Example 26. The circuit component of any of examples 21 through 25, wherein the normally-off transistor is a normally-off GaN transistor, wherein the normally-on transistor is a normally-on GaN transistor, and wherein the normally-on GaN transistor has a higher voltage rating than the normally-off GaN transistor.

Example 27. A cascode solid-state switch device, comprising: a normally-off transistor; and a normally-on transistor having a source electrically connected to a drain of the normally-off transistor, wherein a gate charge of the cascode solid-state switch device is independent of both a voltage class of the cascode solid-state switch device and a drain-to-source on-state resistance of the cascode solid-state switch device.

Terms such as "first", "second", and the like, are used to describe various elements, regions, sections, etc. and are also not intended to be limiting. Like terms refer to like elements throughout the description.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A cascode solid-state switch device, comprising:
a normally-off transistor;
a normally-on transistor having a source electrically connected to a drain of the normally-off transistor; and
a diode circuit comprising a plurality of series-connected first diodes connected in parallel with the normally-off transistor and a plurality of series-connected second diodes connected antiparallel with the normally-off transistor,
wherein a gate of the normally-on transistor is electrically connected to a first node of the series-connected first diodes and a second node between two of the series-connected second diodes, such that the cascode solid-state switch device is driven by a gate charge that is independent of both a voltage class of the cascode solid-state switch device and a drain-to-source on-state resistance of the cascode solid-state switch device.

2. The cascode solid-state switch device of claim 1, wherein the plurality of series-connected first diodes is configured to set a clamp voltage for the normally-off transistor when the normally-off transistor is in an off-state, wherein the clamp voltage is set beyond a threshold voltage of the normally-on transistor, and wherein a voltage between the first node and the source of the normally-on transistor reaches or exceeds the threshold voltage of the normally-on transistor when a voltage across the normally-off transistor in the off-state rises to the clamp voltage.

3. The cascode solid-state switch device of claim 1, wherein the first node is between two of the series-connected first diodes.

4. The cascode solid-state switch device of claim 1, wherein the plurality of series-connected first diodes comprises a plurality of series-connected Schottky diodes.

5. The cascode solid-state switch device of claim 1, wherein the normally-off transistor is a normally-off GaN transistor, wherein the normally-on transistor is a normally-on GaN transistor, and wherein the normally-on GaN transistor has a higher voltage rating than the normally-off GaN transistor.

6. The cascode solid-state switch device of claim 1, wherein the normally-off transistor is a normally-off GaN transistor, wherein the normally-on transistor is a normally-on GaN bidirectional switch device, wherein the normally-on GaN bidirectional switch device has a first source electrically connected to the drain of the normally-off transistor and a second source electrically connected to a drain of an additional normally-off transistor such that the cascode solid-state switch device is a bidirectional device, and wherein the normally-on GaN bidirectional switch device has a higher voltage rating than the normally-off GaN transistor and the additional normally-off GaN transistor.

7. The cascode solid-state switch device of claim 6, further comprising:
an additional diode circuit comprising a plurality of series-connected third diodes connected in parallel with the additional normally-off transistor and at least one fourth diode connected antiparallel with the additional normally-off transistor,
wherein a gate of the additional normally-on transistor is electrically connected to a first node of the series-connected third diodes and a second node of the at least one fourth diode.

8. A power electronics circuit, comprising:
a cascode solid-state switch device; and
a galvanically isolated gate driver configured to drive the cascode solid-state switch device,
wherein the cascode solid-state switch device comprises:
a normally-off transistor;
a normally-on transistor having a source electrically connected to a drain of the normally-off transistor; and
a diode circuit comprising a plurality of series-connected first diodes connected in parallel with the normally-off transistor and a plurality of series-connected second diodes connected antiparallel with the normally-off transistor,
wherein a gate of the normally-off transistor is controlled by the galvanically isolated gate driver,
wherein a gate of the normally-on transistor is electrically connected to a first node of the series-connected first diodes and a second node between two of the series-connected second diodes, such that the cascode solid-state switch device is driven by a gate charge that is independent of both a voltage class of the cascode solid-state switch device and a drain-to-source on-state resistance of the cascode solid-state switch device.

9. The power electronics circuit of claim 8, wherein the plurality of series-connected first diodes is configured to set a clamp voltage for the normally-off transistor when the normally-off transistor is in an off-state, wherein the clamp voltage is set beyond a threshold voltage of the normally-on transistor, and wherein a voltage between the first node and the source of the normally-on transistor reaches or exceeds the threshold voltage of the normally-on transistor when a voltage across the normally-off transistor in the off-state rises to the clamp voltage.

10. The power electronics circuit of claim 8, wherein the first node is between two of the series-connected first diodes.

11. The power electronics circuit of claim 8, wherein the plurality of series-connected first diodes comprises a plurality of series-connected Schottky diodes.

12. The power electronics circuit of claim 8, wherein the normally-off transistor is a normally-off GaN transistor, wherein the normally-on transistor is a normally-on GaN transistor, and wherein the normally-on GaN transistor has a higher voltage rating than the normally-off GaN transistor.

13. A circuit component of a cascode solid-state switch device, the circuit component comprising:

a normally-off transistor; and a diode circuit comprising a plurality of series-connected first diodes connected in parallel with the normally-off transistor and a plurality of series-connected second diodes connected antiparallel with the normally-off transistor, wherein a node of the series-connected first diodes forms a first gate connection node for a normally-on transistor of the cascode solid-state switch device, wherein a node between two of the series-connected second diodes forms a second gate connection node for the normally-on transistor, wherein the plurality of series-connected first diodes is configured to set a clamp voltage for the normally-off transistor when the normally-off transistor is in an off-state, wherein the clamp voltage is set beyond a threshold voltage of the normally-on transistor, wherein a gate charge of the cascode solid-state switch device is independent of both a voltage class of the cascode solid-state switch device and a drain-to-source on-state resistance of the cascode solid-state switch device.

14. The circuit component of claim 13, wherein the first gate connection node is between two of the series-connected first diodes.

15. The circuit component of claim 13, wherein the plurality of series-connected first diodes comprises a plurality of series-connected Schottky diodes.

16. The circuit component of claim 13, wherein the normally-off transistor is a normally-off GaN transistor, wherein the normally-on transistor is a normally-on GaN transistor, and wherein the normally-on GaN transistor has a higher voltage rating than the normally-off GaN transistor.

* * * * *